(12) United States Patent
Miyazawa

(10) Patent No.: US 6,525,996 B1
(45) Date of Patent: Feb. 25, 2003

(54) POWER FEEDING APPARATUS, POWER RECEIVING APPARATUS, POWER TRANSFER SYSTEM, POWER TRANSFER METHOD, PORTABLE APPARATUS, AND TIMEPIECE

(75) Inventor: Osamu Miyazawa, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/622,459

(22) PCT Filed: Sep. 1, 1999

(86) PCT No.: PCT/JP99/04735

§ 371 (c)(1),
(2), (4) Date: Aug. 16, 2000

(87) PCT Pub. No.: WO00/38296

PCT Pub. Date: Jun. 29, 2000

(30) Foreign Application Priority Data

Dec. 22, 1998 (JP) ............................. 10-365277

(51) Int. Cl.$^7$ ........................... G04C 3/00; H01L 41/08; H01L 41/04
(52) U.S. Cl. ........................................ 368/204; 310/319
(58) Field of Search ................. 368/204, 203; 310/317, 319, 321, 328, 334

(56) References Cited

U.S. PATENT DOCUMENTS

| | | | | |
|---|---|---|---|---|
| 3,521,089 A | * | 7/1970 | Stuetzer | 310/321 |
| 3,591,862 A | | 7/1971 | Winston | |
| 4,031,449 A | | 6/1977 | Trombly | |
| 5,682,076 A | | 10/1997 | Zumeris | |
| 5,982,297 A | * | 11/1999 | Welle | 340/870.16 |
| 6,097,675 A | * | 8/2000 | Takahashi et al. | 368/204 |
| 6,266,296 B1 | * | 7/2001 | Miyazawa | 310/323.01 |

FOREIGN PATENT DOCUMENTS

| | | |
|---|---|---|
| EP | 0 298 707 | 1/1989 |
| JP | 50-142051 | 11/1975 |
| JP | 52-64642 | 5/1977 |
| JP | 55-125052 | 9/1980 |
| JP | 59-37672 | 9/1984 |
| JP | 62-297779 | 12/1987 |
| JP | 63-228933 | 9/1988 |
| JP | 64-12450 | 1/1989 |
| JP | 64-23728 | 1/1989 |
| JP | 64-23729 | 1/1989 |
| JP | 64-23730 | 1/1989 |
| JP | 64-023730 | 1/1989 |
| JP | 2-10189 | 1/1990 |
| JP | 2-41673 | 2/1990 |
| JP | 6-29753 | 8/1994 |
| JP | 07-273693 | 10/1995 |
| JP | 7-273697 | 10/1995 |
| JP | 2576869 | 11/1996 |
| JP | 10-225151 | 8/1998 |
| JP | 2822033 | 9/1998 |
| WO | WO 99/49552 | 9/1999 |

* cited by examiner

Primary Examiner—Vit Miska
Assistant Examiner—Jeanne-Marguerite Goodwin
(74) Attorney, Agent, or Firm—Michael T. Gabrik

(57) ABSTRACT

In a power feeding apparatus A1, a drive circuit 11 receives electrical power supplied from a power supply 10 and generates a driving signal V. In response to this, an actuator 12 vibrates, and this vibration is transmitted through vibration transmission members 14 and 20 to a converter 21 of a power receiving apparatus B1. The converter 21 includes a piezoelectric device. Accordingly, vibration is converted into voltage, thus generating an electromotive voltage Vg. The electromotive voltage Vg is rectified by a rectification circuit 23, and a large-capacitance capacitor 24 is charged with rectified voltage. A clock circuit 25 receives power from the large-capacitance capacitor 24 and measures time.

28 Claims, 10 Drawing Sheets

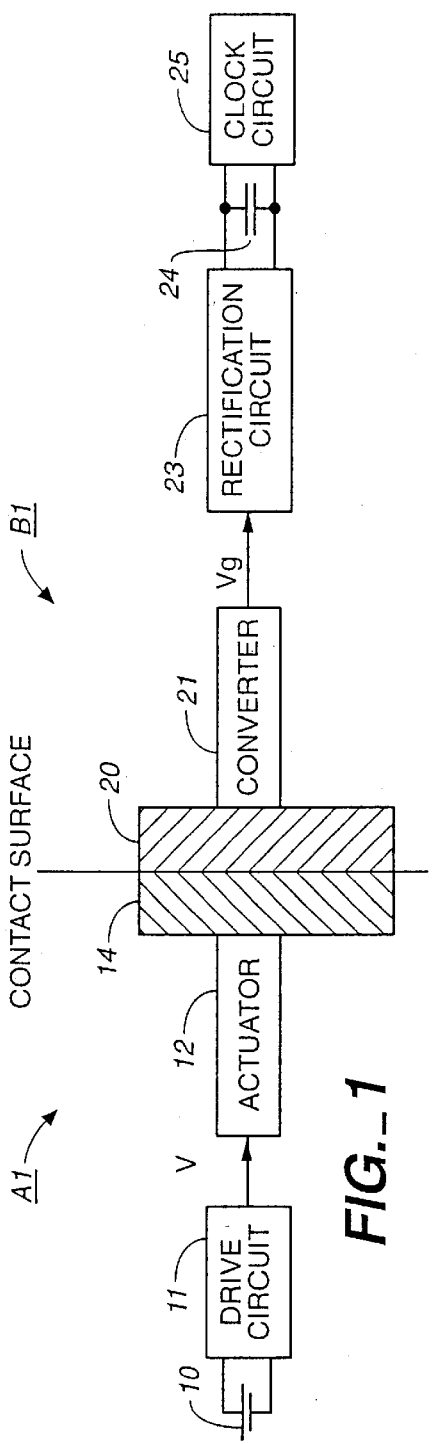
*FIG._1*
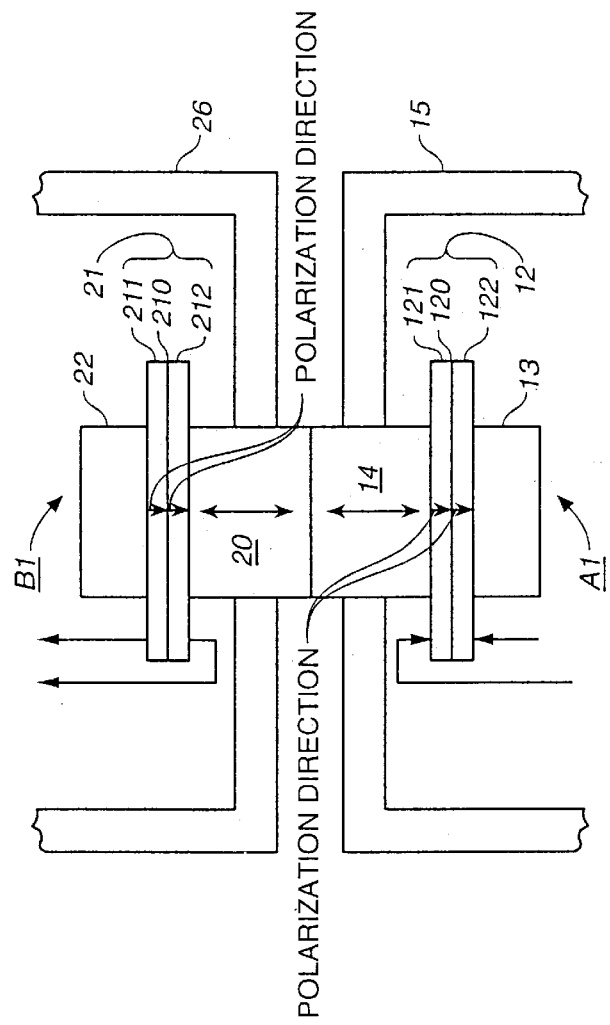
*FIG._2*

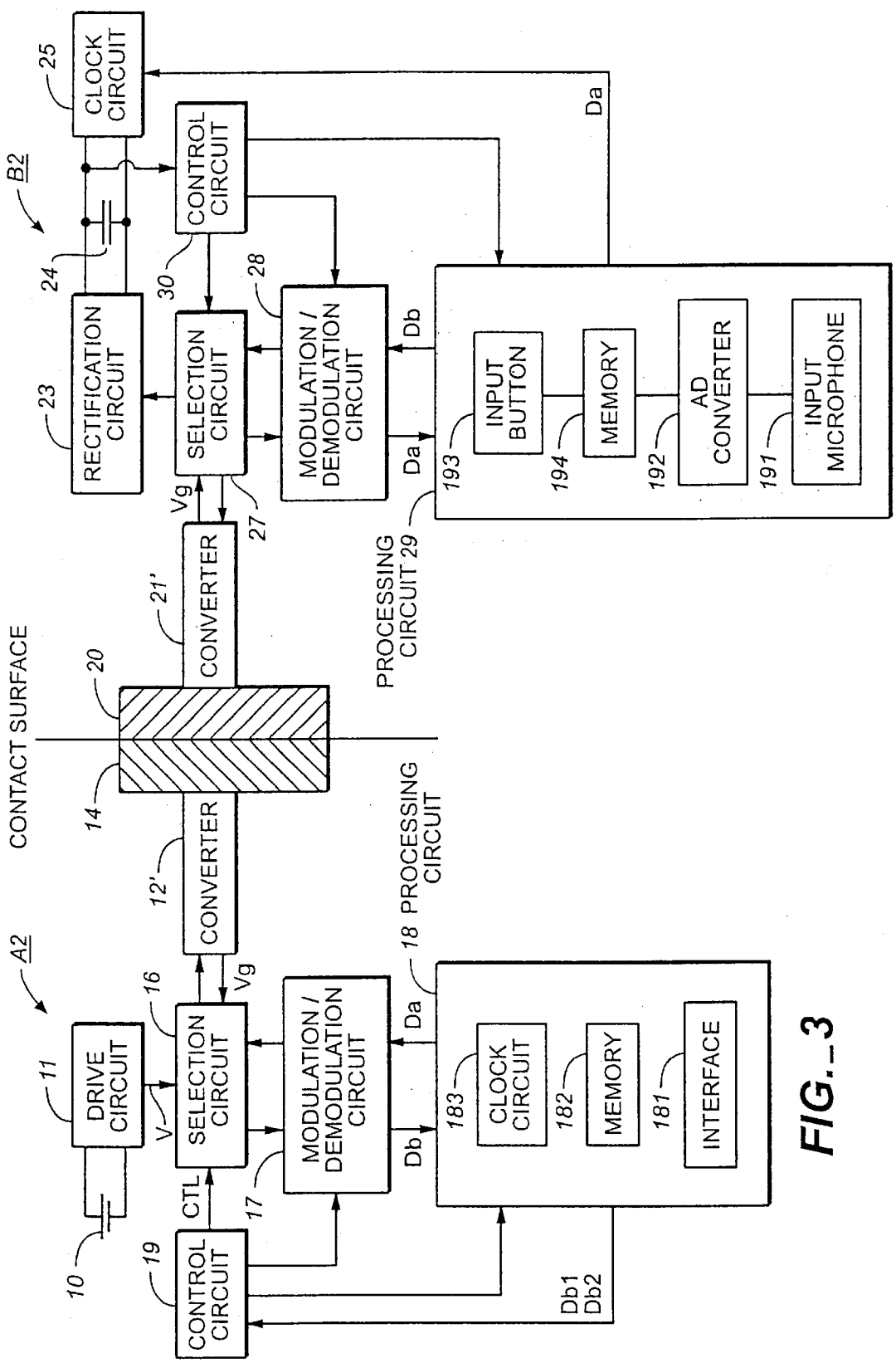
FIG._3

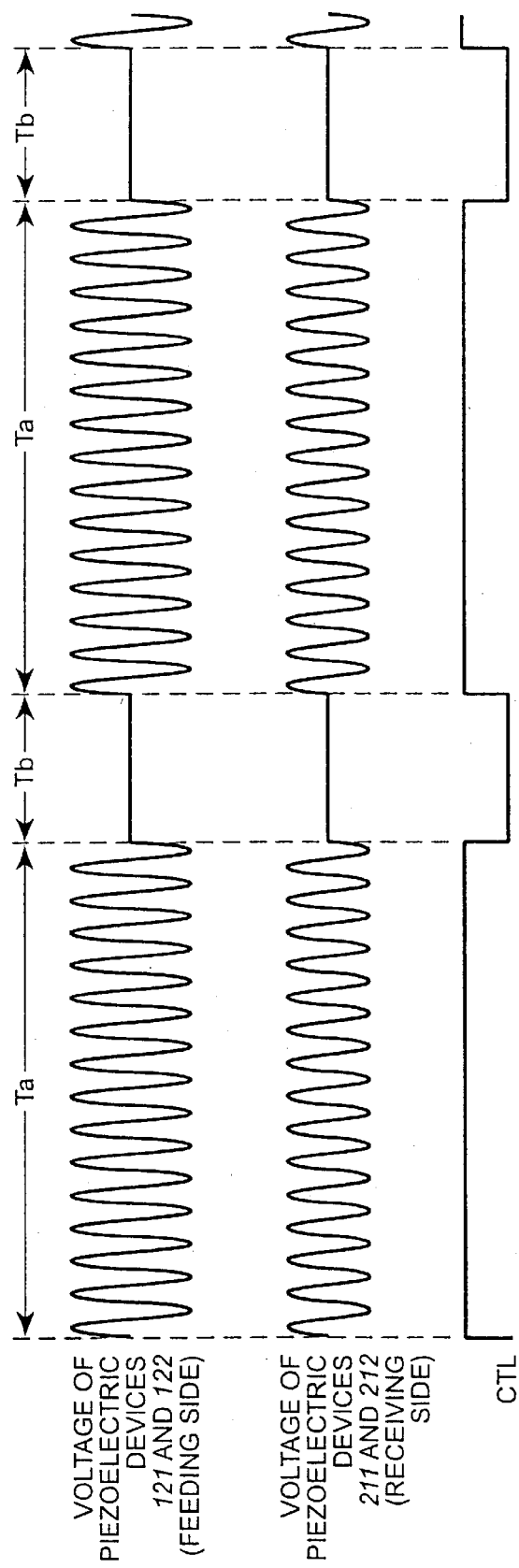
FIG._4

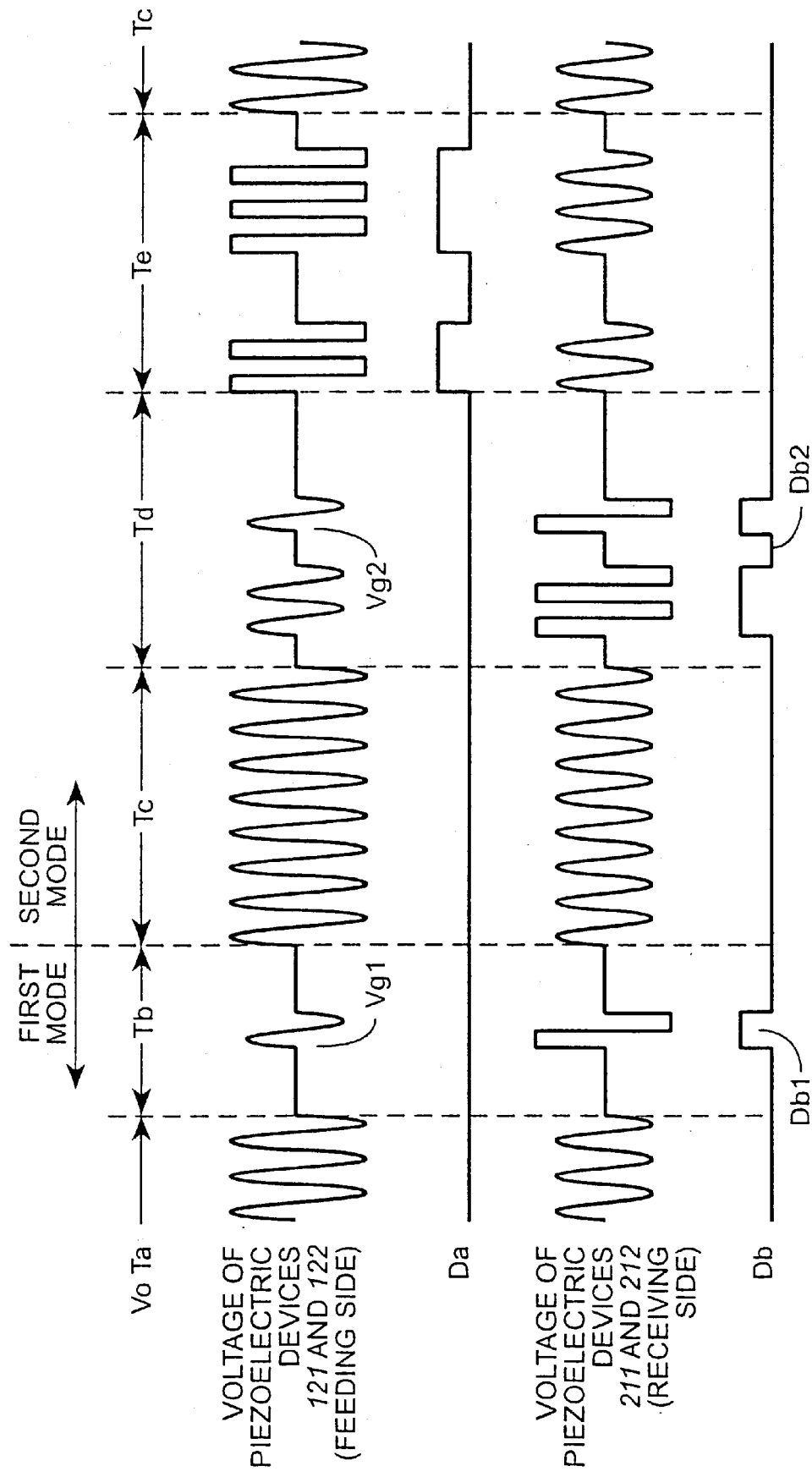
FIG._5

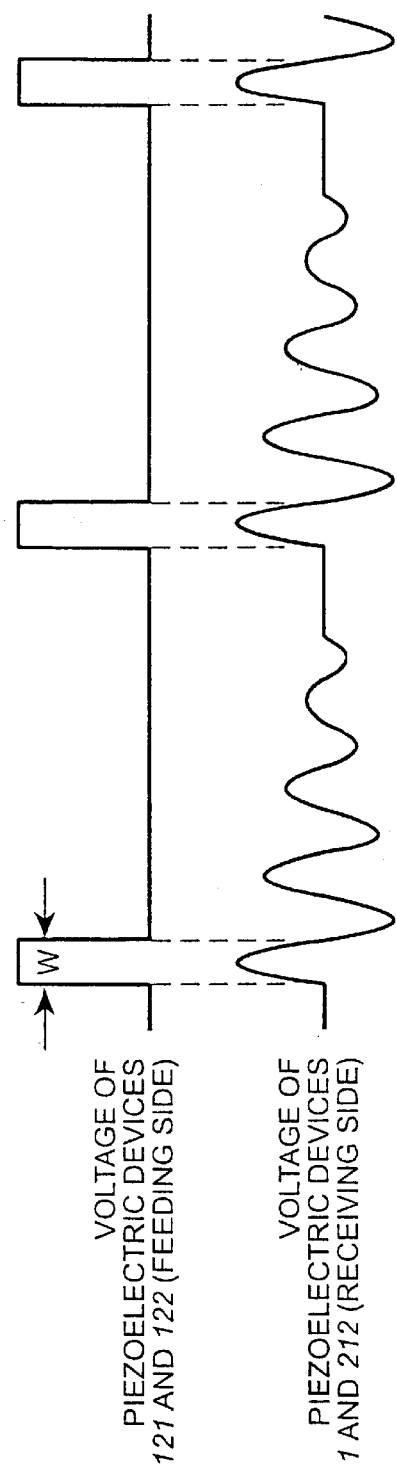
FIG._6
VOLTAGE OF PIEZOELECTRIC DEVICES 121 AND 122 (FEEDING SIDE)
VOLTAGE OF PIEZOELECTRIC DEVICES 211 AND 212 (RECEIVING SIDE)
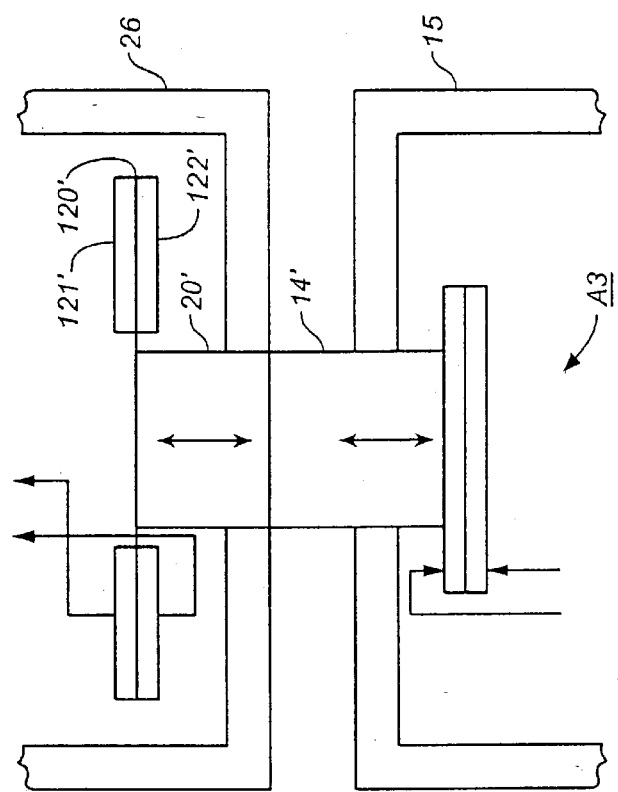
FIG._7

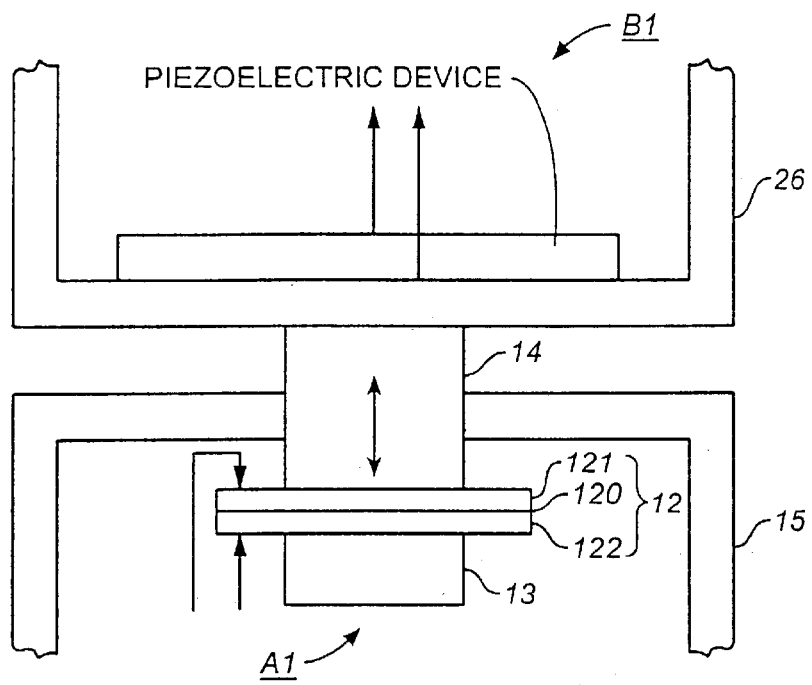
FIG._8
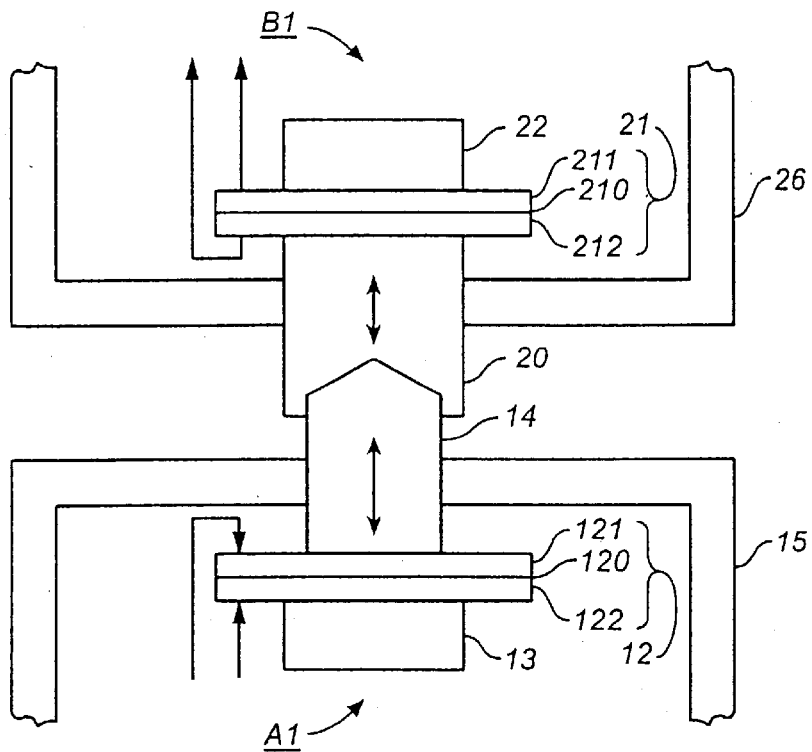
FIG._9

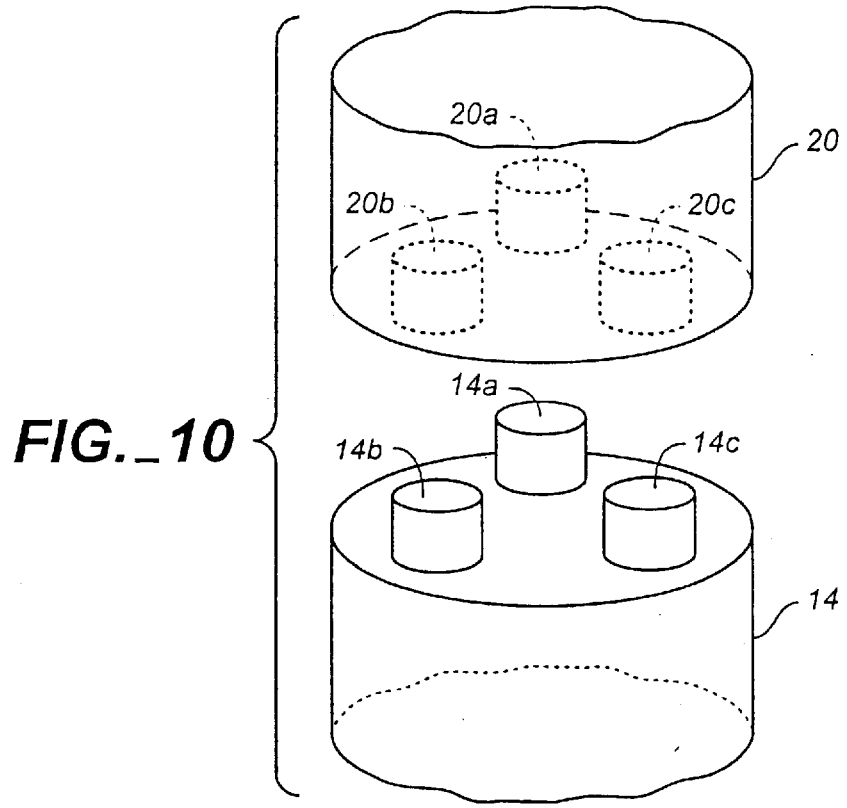
FIG._10
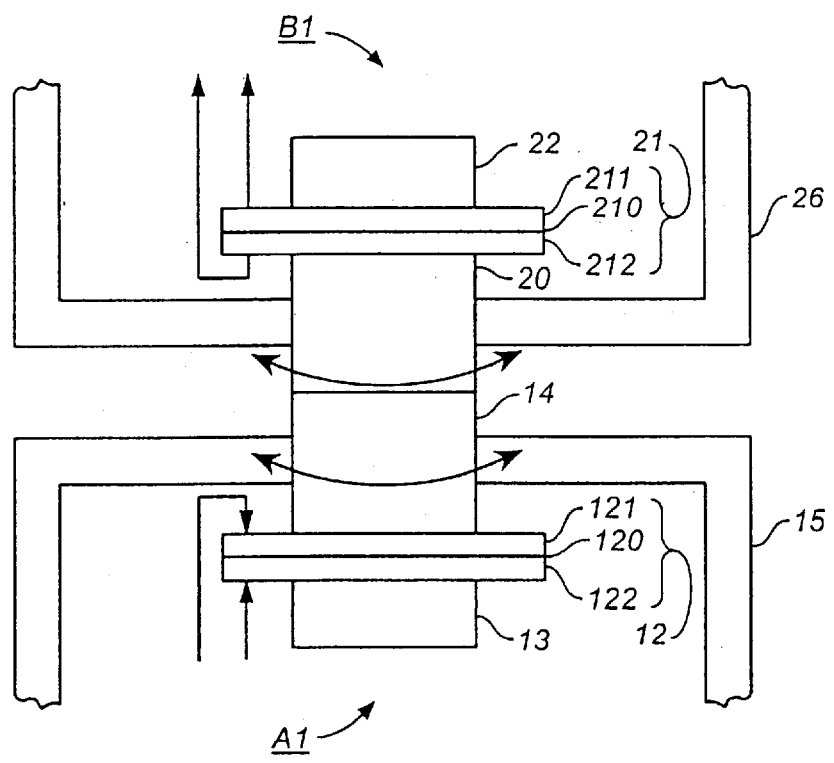
FIG._11

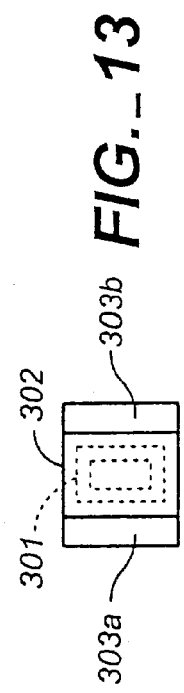
FIG._13
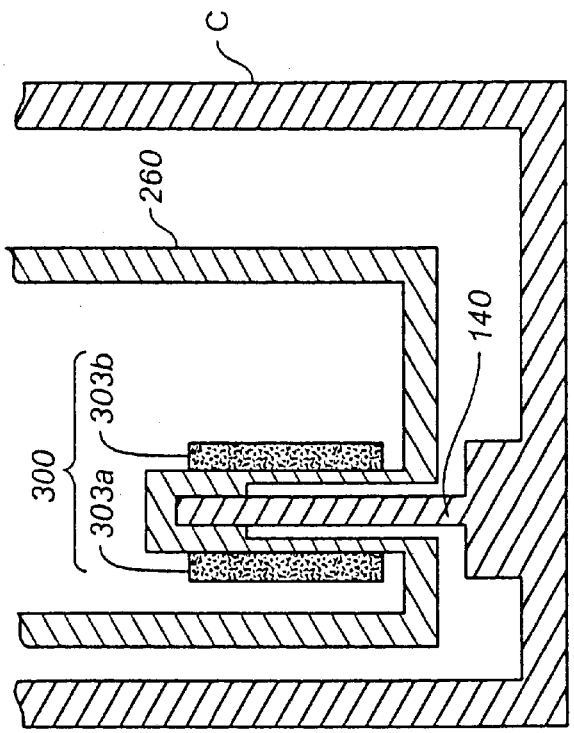
FIG._14
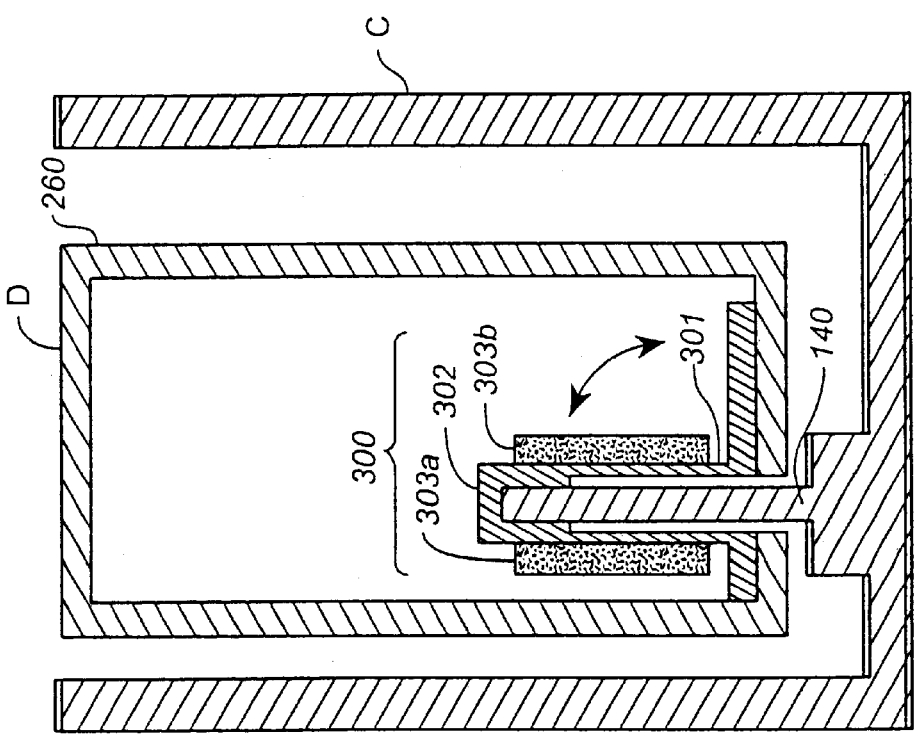
FIG._12

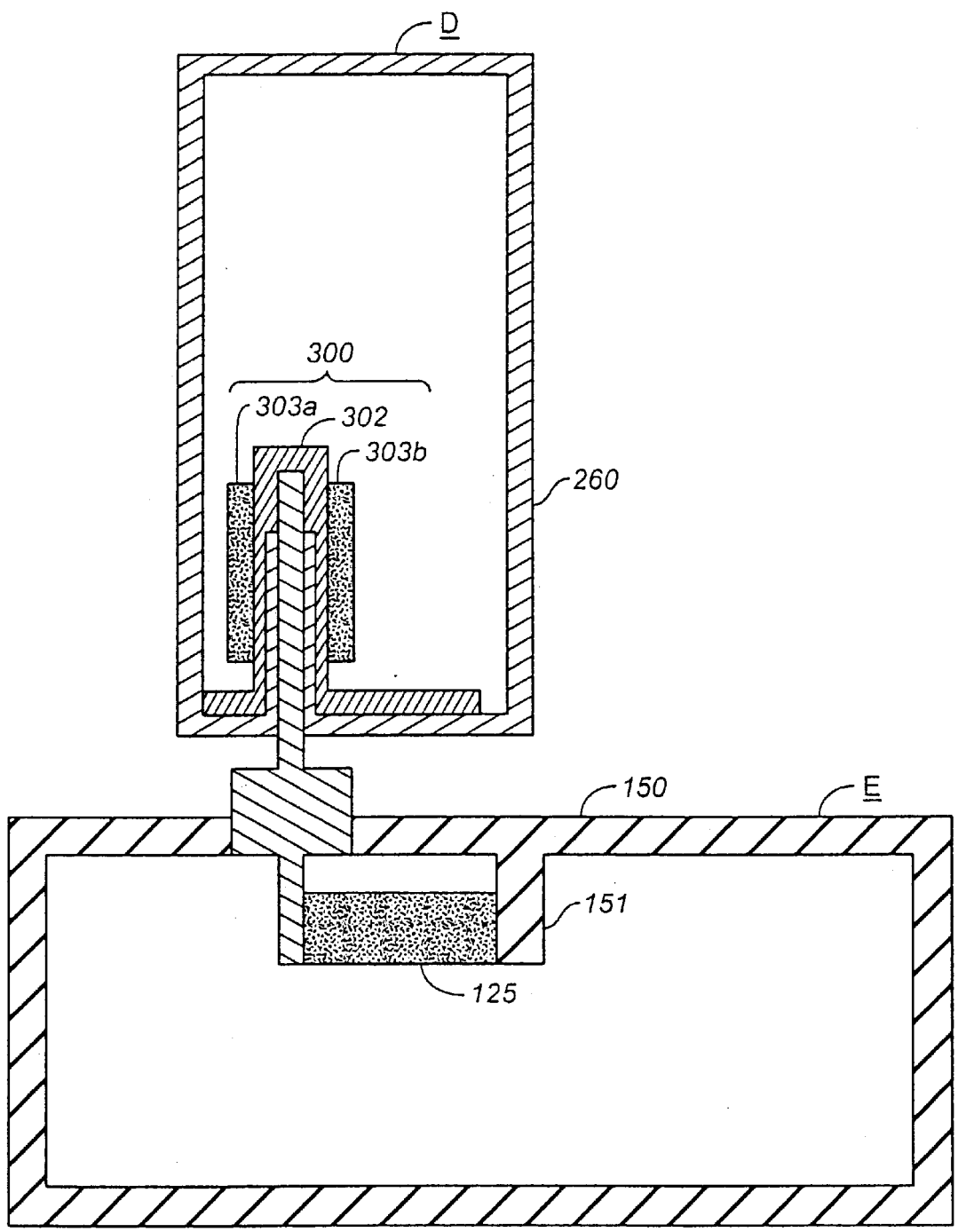
FIG._15

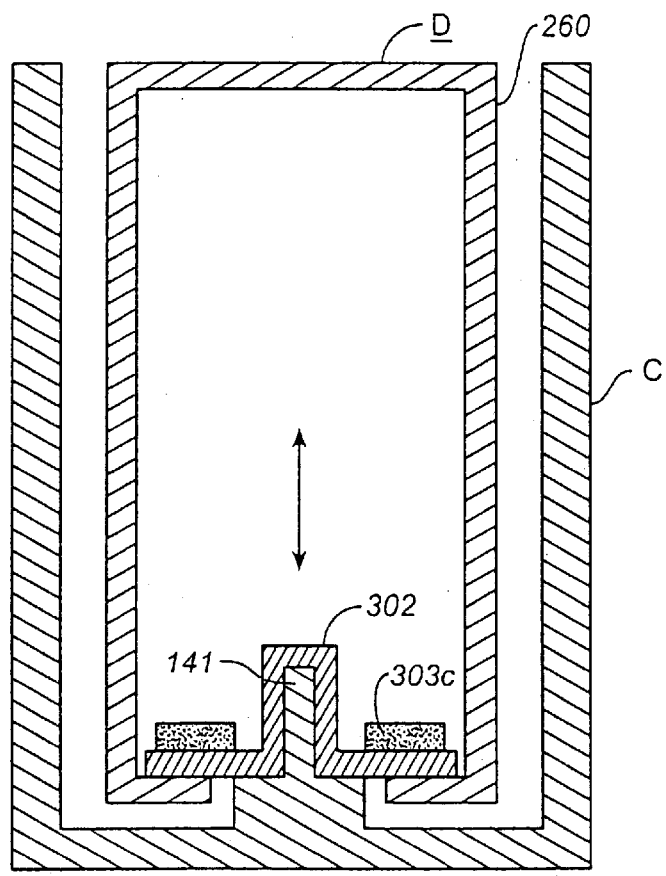
FIG._16
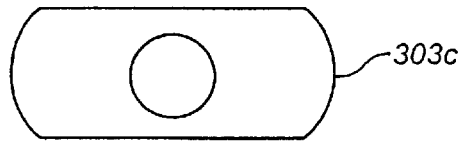
FIG._17
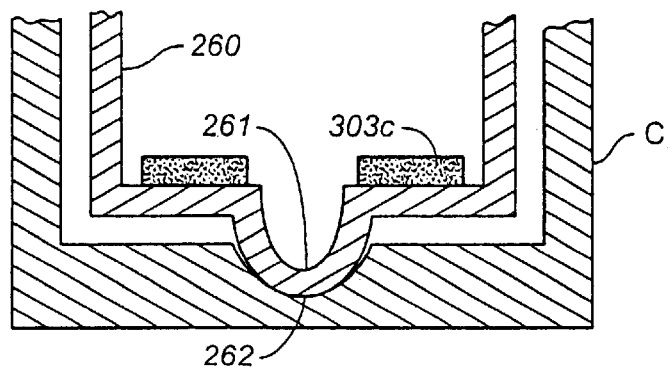
FIG._18

POWER FEEDING APPARATUS, POWER RECEIVING APPARATUS, POWER TRANSFER SYSTEM, POWER TRANSFER METHOD, PORTABLE APPARATUS, AND TIMEPIECE

TECHNICAL FIELD

The present invention relates to a power feeding apparatus suitable for transferring power, a power receiving apparatus, a power transfer system, a power supply method, a portable apparatus, and a timepiece.

BACKGROUND ART

A small electronic timepiece, such as a wristwatch, may include therein a small primary battery, a clock circuit, and a clock-hand mechanism. In general, power supplied from the primary battery is employed to drive the clock circuit, the clock-hand mechanism, and the like. Such an electronic apparatus including the primary battery has a problem in that the battery must be replaced or discarded.

Accordingly, the electronic apparatus may include a rechargeable secondary battery. A feed terminal for charging the secondary battery may be provided on an outer casing of the electronic timepiece.

When the feed terminal is provided on the outer casing of the electronic apparatus, there is a problem in that the feed terminal may become corroded. In particular, the feed terminal used in the electronic timepiece to be wrapped around a wrist of a user with a belt is apt to be corroded by sweat from the user or by water, thus degrading charging reliability. In addition, the electronic apparatus with a structure having the exposed feed terminal is difficult to be made waterproof.

Internal circuits of the electronic apparatus may pick up noise from the feed terminal, thus causing malfunction of the electronic apparatus. For example, when a user having the electronic timepiece around the wrist uses a cellular phone, electromagnetic waves emitted from the cellular phone may enter the electronic timepiece through the feed terminal as noise and cause malfunction of the electronic timepiece. An electronic apparatus having a data input/output terminal for inputting/outputting data has a similar disadvantage in that it may pick up noise.

In order to solve the battery waste problem, it is possible to propose a system in which the electronic timepiece is externally irradiated with electromagnetic waves, internally receives the electromagnetic waves, and converts the received electromagnetic waves into electrical power. Since metal has a property of blocking the electromagnetic waves, it is impossible to use metal for a casing portion of the electronic apparatus in this system.

A battery charger for charging a cellular phone including the built-in secondary battery is larger than the cellular phone itself. In addition, the battery charger generates the voltage required to charge the secondary battery by receiving power from a commercial power supply. Thus, it is impossible to easily charge the cellular phone.

DISCLOSURE OF THE INVENTION

Accordingly, it is an object of the present invention to provide a power feeding apparatus for supplying power by means of vibrations and a power receiving apparatus for receiving power from the vibrations from the power feeding apparatus. It is another object of the present invention to transmit data using vibrations.

A power feeding apparatus according to the present invention converts electrical power into vibrations and thereby transfers the electrical power to a power receiving apparatus. The power feeding apparatus includes a vibration exciter including a contact surface to be in contact with the power receiving apparatus and an excitation surface to be vibrated; an actuator for vibrating the excitation surface of the vibration exciter; a power supply for feeding power; and a drive circuit for receiving power from the power supply and outputting a driving signal for driving the actuator.

According to the present invention, the power feeding apparatus converts electrical power into vibrations and thereby outputs the electrical power to the power receiving apparatus. Therefore, it is not necessary to provide a terminal electrode for supplying power to the power feeding apparatus. Hence, problems of potential corrosion and of noise being picked up from the terminal electrode cannot occur.

Preferably, the actuator includes a piezoelectric device. Since a piezoelectric device can be miniaturized, it is suitable for miniaturization of the apparatus. The actuator may vibrate the vibration exciter longitudinally, i.e., in a direction perpendicular to the contact surface. Alternatively, the actuator may cause the vibration exciter to vibrate torsionally.

The vibration exciter may be part of a casing of the power feeding apparatus. In this case, the vibration exciter can be formed at the same time as the casing is formed. Hence, the number of components of the power feeding apparatus can be reduced.

A power receiving apparatus according to the present invention includes a vibrator to be displaced by vibrations of the apparatus; a converter for converting displacements of the vibrator into electrical power; and a secondary battery for storing electrical power obtained by the converter. According to the present invention, it is not necessary to provide the power receiving apparatus with a terminal electrode for receiving power. Hence, problems of potential corrosion and of noise being picked up from the terminal electrode cannot occur. Since electrical power transferred to a secondary battery can be accumulated, it is possible to obtain electrical power from the secondary battery and to use the electrical power after the power transfer is terminated.

The converter may include a piezoelectric device, and the piezoelectric device may obtain voltage generated by the displacement of the piezoelectric device as the electrical power. The vibrator and the converter may be integrated, and the converter may obtain electrical power by resonance. In this case, the piezoelectric device is greatly displaced, so that a large electromotive voltage can be obtained.

The vibrator may be connected to a casing of the apparatus. Alternatively, the vibrator may be part of the casing of the apparatus. In this case, the vibrator can be formed at the same time as the casing is formed. Therefore, the number of components can be reduced.

A portable apparatus according to the present invention includes a power receiving apparatus and a power-using unit activated by power supplied from the secondary battery.

The portable apparatus may be stored in a storage case including a convex portion protruding from an inner wall. The portable apparatus may include a concave portion into which the convex portion is inserted. The concave portion may be formed in the vibrator. Alternatively, the portable apparatus may be stored in a storage case including a concave portion in an inner wall of a bottom surface.

Preferably, a convex portion engageable with the concave portion is formed on a bottom surface of the apparatus and the vibrator is a casing of the apparatus. In this case, the portable apparatus is vibrated by vibrations from the movements of a user carrying the portable apparatus in the storage case. Hence, the concave portion as the vibrator or the casing itself is vibrated, thus charging the secondary battery.

A timepiece according to the present invention includes a power receiving apparatus and a clock unit for receiving power supplied from the secondary battery and for measuring time.

A power, transfer system according to the present invention includes a power feeding apparatus and a power receiving apparatus. Electrical power is transferred from the power feeding apparatus to the power receiving apparatus by transmitting vibrations of the vibration exciter to the vibrator.

In this case, it is preferable that the vibration exciter protrude from the power feeding apparatus and engage the power feeding apparatus. According to the present invention, the vibration exciter serves both as the vibration exciter and the holder.

Alternatively, one of the vibration exciter and the vibrator may be provided with a concave portion and the other with a convex portion, and the concave portion and the convex portion may be engageable with each other. In this case, the vibration exciter and the vibrator can be intimately connected. Hence, the vibrations can be efficiently transmitted, thus improving the power transmission efficiency.

Preferably, the drive circuit drives the actuator so that the vibration exciter vibrates at a frequency near a natural oscillation frequency of the vibrator and the converter as one united body. In this case, the vibrations can be transmitted by resonance. Hence, large amounts of electrical power can be obtained from the converter.

The vibration exciter may vibrate the vibrator intermittently and the vibrator may obtain electrical power in the course of vibration attenuation.

A power transfer method according to the present invention feeds electrical power from a power feeding apparatus including a power supply, an actuator, and a vibration exciter to a power receiving apparatus including a vibrator. The power transfer method includes the steps of receiving power from the power supply and driving the actuator; vibrating the vibration exciter by the actuator; vibrating the vibrator by the vibration exciter; and converting vibrations of the vibrator into electrical power. According to the present invention, electrical power can be transferred by means of vibrations.

A power transfer method according to the present invention transfers electrical power and data by means of vibrations between a power feeding apparatus including a first piezoelectric device and a first vibration transmission member connected to the first piezoelectric device and a power receiving apparatus including a second piezoelectric device and a second vibration transmission member connected to the second piezoelectric device. The power transfer method includes the step of bringing the first vibration transmission member into contact with the second vibration transmission member; and executing, using time-sharing, a first period for transferring electrical power from the power feeding apparatus to the power receiving apparatus, a second period for transmitting first data from the power feeding apparatus to the power receiving apparatus, and a third period for transmitting second data from the power receiving apparatus to the power feeding apparatus. According to the present invention, not only electrical power but also data can be transmitted in either direction.

In this case, the first period may include the steps of applying voltage to the first piezoelectric device and vibrating the first piezoelectric device; vibrating the first vibration transmission member by the first piezoelectric device; vibrating the second vibration transmission member by the first vibration transmission member; and obtaining electrical power based on an electromotive voltage of the second piezoelectric device. The second period may include the steps of applying voltage to the first piezoelectric device in accordance with the first data and vibrating the first piezoelectric device; vibrating the first vibration transmission member by the first piezoelectric device; vibrating the second vibration transmission member by the first vibration transmission member; vibrating the second piezoelectric device by the second vibration transmission member; and reading the first data based on the electromotive voltage of the second piezoelectric device. The third period may include the steps of applying voltage to the second piezoelectric device in accordance with the second data and vibrating the second electric voltage; vibrating the first vibration transmission member by the first piezoelectric device; vibrating the second vibration transmission member by the first vibration transmission member; vibrating the second piezoelectric device by the second vibration transmission member; and reading the second data based on the electromotive voltage of the second piezoelectric device.

BRIEF DESCRIPTION OF THE DRAWINGS

FIG. 1 is a block diagram of a power transfer system according to a First Embodiment of the present invention.

FIG. 2 is a sectional view of a mechanical structure of the power transfer system of the embodiment.

FIG. 3 is a block diagram of a power transfer system according to a Second Embodiment of the present invention.

FIG. 4 is a timing chart describing an operation in a first mode of the above embodiment FIG. 5 is a timing chart describing an operation in a second mode of the above embodiment.

FIG. 6 is a timing chart in a case in which piezoelectric devices are driven at intermittent pulses in a modification (1).

FIG. 7 is a sectional view of an example in which a vibration transmission member is integrated with a casing in a modification (2).

FIG. 8 is a sectional view of an example in which the piezoelectric device is secured to an internal bottom surface of the casing in a modification (3).

FIG. 9 is a sectional view of an example in which the vibration transmission member is provided with a convex portion and a concave portion in a modification (4).

FIG. 10 is a perspective view of an example in which the vibration transmission member is provided with a protrusion and a hole in a modification (6).

FIG. 11 illustrates a torsional vibration in another modification.

FIG. 12 is a sectional view of a cellular phone stored in a carrying case in modification (6).

FIG. 13 is a plan view of a jack portion of another modification.

FIG. 14 is a partial sectional view of another example of the cellular phone stored in the carrying case in another Modification.

FIG. 15 is a sectional view of a state in which the cellular phone of modification and a power feeding apparatus are connected.

FIG. 16 is a sectional view of another example of the cellular phone stored in the carrying case in another modification.

FIG. 17 is a plan view of the piezoelectric device of another modification.

FIG. 18 is a partial sectional view of another example of the cellular phone stored in the carrying case in another modification.

BEST MODE FOR CARRYING OUT THE INVENTION

1. First Embodiment

A power transfer system according to the First Embodiment of the present invention is described hereinafter with reference to the drawings.

[1-1: Structure of the First Embodiment]

FIG. 1 is a block diagram of the power transfer system according to the First Embodiment of the present invention. FIG. 2 is a sectional view of the mechanical structure of the power transfer system.

As shown in FIG. 1, the power transfer system includes a power feeding apparatus A1 and a power receiving apparatus B1. The power feeding apparatus A1 converts electrical energy into mechanical energy and outputs the energy in the form of vibrations. Power is input in the form of vibrations to the power receiving apparatus B1, and the power receiving apparatus B1 converts mechanical energy into electrical energy. The power feeding apparatus A1 and the power receiving apparatus B1 are separable. For example, the power receiving apparatus B1 is a wristwatch-type electronic timepiece to be worn by a user when going out. The power feeding apparatus A1 corresponds to a charging apparatus for charging the electronic timepiece, which is also used as a stand on which the electronic timepiece may be placed at home or the like.

[1-1-1: Structure of the Power Feeding Apparatus]

Main portions of the power feeding apparatus A1 include a power supply 10, a driving circuit 11, an actuator 12, a fixing member 13, a vibration transmission member 14, and a casing 15.

The power supply 10 generates DC voltage. The power supply 10 includes an AC-DC converter for rectifying AC voltage from a commercial power supply and generating a predetermined voltage, or a primary battery, such as a dry-cell battery.

The driving circuit 11 receives power from the power supply.Q and generates a driving signal V for driving the actuator 12. Concerning the driving circuit 11, a Colpitts oscillator may be used.

The actuator 12 is in the form of a disk. As shown in FIG. 2, the actuator 12 has a layered structure having piezoelectric devices 121 and 122 on top and bottom surfaces of a shim plate 120. The shim plate 120 includes, for example, a phosphor-bronze sheet. The shim plate 120 operates as an elastic plate and as an intermediate electrode of the piezoelectric devices 121 and 122. Concerning materials for the piezoelectric devices 121 and 122, various materials including quartz crystal, lithium niobate, barium titanate, lead titanate, lead metaniobate, polyvinylidene fluoride, lead zirconate titanate, lead niobate plumbite ($(Pb(Zn_{1/3}\text{-}Nb_{2/3})O_3)_{1-x}\text{-}Pb\,Ti\,O_3\,x$)x may vary depending on each composition, and x=approximately 0.09), scandium lead niobate ($(Pb\{Sc_{1/2}Nb_{1/2}\})_{1-x}\,Ti_x)O_3$)x may vary depending on each composition, and x=approximately 0.09) can be used.

In general, a case in which the direction of an electrical field applied to a piezoelectric device coincides with the direction of displacement (distortion) is referred to as exhibiting a longitudinal effect. A case in which the direction of the electrical field and the direction of displacement meet at right angles is referred to as exhibiting a transversal effect. In the example, the longitudinal effect is employed to drive the piezoelectric devices 121 and 122.

The polarization directions of the piezoelectric device 121 and of the piezoelectric device 122 are set so as to coincide with each other, as indicated by arrows in the drawing. When the driving signal V is supplied, one piezoelectric device expands simultaneously as the other piezoelectric device expands in the vertical direction (hereinafter referred to as a longitudinal direction) with respect to the longitudinal direction. One piezoelectric device contracts simultaneously as the other piezoelectric device contracts in the longitudinal direction. Therefore, when AC voltage is applied, the actuator 12 expands and contracts in the longitudinal direction. The actuator 12 is operable as a converter for converting voltage into vibrations.

The fixing member 13 is fixed on an inner wall (not shown) of a side of the casing 15. The top surface of the fixing member 13 is attached to a bottom surface of the piezoelectric device 122. Thus, the bottom surface of the piezoelectric device 122 operates as a fixed surface even when vibration is generated in the actuator 12.

The vibration transmission member 14 is in the form of a disk. A bottom surface of the vibration transmission member 14 is attached to a top surface of the piezoelectric device 121. The casing 15 is provided with a through hole having a diameter somewhat greater than the diameter of the vibration transmission member 14. The vibration transmission member 14 is inserted into the through hole, and the vibration transmission member 14 protrudes from the casing 15. The vibration transmission member 14 is constructed so as to output energy in the form of vibrations and operates as a vibration exciter for vibrating the power feeding apparatus B.

[1-1-2: Structure of the Power Receiving Apparatus]

Main portions of the power receiving apparatus B1 include a vibration transmission member 20, a converter 21, a fixing member 22, a rectification circuit 23, a large-capacity capacitor 24, a clock circuit 25, and a casing 26.

The vibration transmission member 20 is in the form of a disk. The vibration transmission member 20 protrudes from a bottom surface of the power receiving apparatus B1 through a through hole in the casing 26. When transferring electrical power, the power receiving apparatus B1 is placed on the power feeding apparatus A1, as shown in FIG. 2. In this state, a bottom surface of the vibration transmission member 20 is brought into contact with a top surface of the vibration transmission member 14. When the vibration transmission member 14 vibrates longitudinally, i.e., in a direction perpendicular with respect to the contact surface between the vibration transmission member 20 and the vibration transmission member 14, the vibration transmission member 20 vibrates in the same direction. In other words, the vibration transmission member 20 operates as a vibrator and is vibrated by the vibration exciter which is the vibration transmission member 14.

The converter 21 is in the form of a disk. The converter 21 has a layered structure having piezoelectric devices 211 and 212 on top and bottom surfaces of a shim plate 210. The fixing member 22 is disposed on a top surface of the piezoelectric device 211. The fixing member 22 is fixed on an inner surface of a side of the casing 26. When the vibration transmission member 22 vibrates, the piezoelectric devices 211 and 212 are displaced to generate an electromotive voltage Vg. Specifically, the converter 21 converts vibration into voltage.

The rectification circuit 23 shown in FIG. 1 rectifies the electromotive voltage Vg and charges the large-capacity capacitor 24 with the rectified voltage. The rectification circuit 23 may perform half-wave rectification or full-wave rectification. The full-wave rectification is preferred in terms of efficiency.

The clock circuit 25 receives electrical power from the large-capacity capacitor 24 and measures time. In addition, the clock circuit 25 drives a clock-hand motor for moving clock hands (not shown) in accordance with the measured time.

When vibration frequency is gradually increased while a force of a constant strength is applied to a mechanical structure, the amplitude of the movement of the structure reaches a maximum at a certain frequency and then reaches a minimum, and these minimums and maximums are repeatedly encountered. Specifically, there are a number of frequencies at which the amplitude reaches the maximum. The frequencies corresponding to the maximum amplitude are collectively referred to as natural oscillation frequencies. A mode of oscillation associated with the lowest natural oscillation frequency is referred to as the first oscillation mode, and a mode of oscillation associated with the second lowest natural oscillation frequency is referred to as the second oscillation mode, and so on.

When the structure vibrates at the natural oscillation frequencies in these frequency modes, the mechanical impedance thereof reaches a minimum. It is thus possible to easily obtain great displacement by a small driving force.

In this example, a frequency of the driving signal V is set to substantially coincide with the natural oscillation frequency of the vibration transmission member 14 and the vibration transmission member 20 as one united member.

[1-2: Operation of the First Embodiment]

An operation of the power transfer system according to the present embodiment is described below.

In order to supply electrical power from the power feeding apparatus A1 to the power receiving apparatus B1, the power receiving apparatus B1 is placed on the power receiving apparatus B1, thus bringing the vibration transmission member 14 into physical contact with the vibration transmission member 20.

When the power feeding apparatus A1 is activated in this state, the drive circuit 11 receives power from the power supply 10 and generates the driving signal V. When the driving signal V is supplied to the actuator 12, the actuator 12 vibrates in the longitudinal direction. Accordingly, the vibration transmission member 14 vibrates in the longitudinal direction. In this case, the vibration transmission member 14 operates as the vibration exciter and vibrates the vibration transmission member 20 that functions as the vibrator. Then, the vibration transmission member 20 is vibrated, and the piezoelectric devices 211 and 212 forming the converter 21 are vibrated. Since the frequency of the driving signal V is set to substantially coincide with the natural oscillation frequency of the vibration transmission member 14 and the vibration transmission member 20 as one united member, the vibration transmission members 14 and 20 are vibrated at a low mechanical impedance. Therefore, the piezoelectric devices 211 and 212 are greatly displaced, and a large electromotive voltage Vg is thus obtained.

When the piezoelectric devices 211 and 212 generate the electromotive voltage Vg, the rectification circuit 23 rectifies the electromotive voltage Vg and charges the large-capacity capacitor 24 with the rectified voltage. Accordingly, electrical power is transferred from the power feeding apparatus A to the power receiving apparatus B.

According to the present embodiment, energy is transferred in the form of vibrations. Energy is adequately transferable when the vibration transmission member 14 and the vibration transmission member 20 are brought into mechanical contact with each other. It is thus unnecessary to provide an electrical contact for transferring energy. Specifically, an electrode for transferring power is unnecessary. Hence, a disadvantage, such as noise pickup due to corrosion of an electrode and static electricity, does not occur.

Since the vibration transmission member 14 and the vibration transmission member 20 are brought into direct contact with each other, it is possible to transfer energy at high transfer efficiency. Since the frequency of the driving signal V is set to correspond to the natural oscillation frequency of the vibration transmission members 14 and 20, it is possible to obtain a large electromotive voltage Vg.

2. Second Embodiment

A power transfer system according to the Second Embodiment is described hereinafter with reference to the drawings. This power transfer system adds a data transmitting function to the power transfer system described in the First Embodiment. A power feeding apparatus A2 of this example includes an interface with a personal computer. A power receiving apparatus B2 includes a data input function for inputting data to a wristwatch-type electronic timepiece using an operation button and a data storage function for converting an analog audio signal into a digital signal and storing the data.

[2-1: Structure of the Second Embodiment]

Since a mechanical structure of the power transfer system according to the Second Embodiment is the same as that of the First Embodiment shown in FIG. 2, description of the mechanical structure has been omitted. FIG. 3 is a block diagram of an electrical structure of the power transfer system according to the Second Embodiment.

The power feeding apparatus A2 includes the power supply 10, the drive circuit 11, a converter 12' (corresponding to the actuator 12 in the First Embodiment), a selection circuit 16, a modulation/demodulation circuit 17, a processing circuit 18, and a control circuit 19.

The converter 12' has the same mechanical structure as the actuator 12 of the First Embodiment. The converter 12' is different from the actuator 12 of the First Embodiment in that the converter 12' functions as a converter for converting electrical energy into kinetic energy and for converting kinetic energy into electrical energy. The actuator 12 of the First Embodiment converts electrical energy into kinetic energy, but does not perform the reverse conversion.

The selection circuit 16 connects the driving circuit 11 and the converter 12' or the modulation/demodulation circuit 17 and the converter 12' based on a control signal supplied from the control signal 19.

Under the control of the control circuit 19, the modulation/demodulation circuit 17 operates as a modulation circuit when transmitting data Da from the power feeding apparatus A2 to the power receiving apparatus B2 or as a demodulation circuit when transmitting data Db from the power receiving apparatus B2 to the power feeding apparatus A2. Among various modulation systems, return zero (RZ) modulation is employed in this example. Because the return zero modulation has no DC component, it is suitable for data transmission by means of vibrations.

Concerning the data Da, there is time information for setting the correct time, phone number information, and the like. Concerning the data Db, there is information input by a user to the power receiving apparatus B2 and audio information.

The processing circuit 18 includes an interface 181, memory 182, and a clock circuit 183. The interface 181 is connected to an external personal computer and performs data input and output. The memory 182 stores data fetched from the personal computer through the interface 181 or data Db transmitted from the power receiving apparatus B2. Accordingly, the data Db stored in the memory 182 can be forwarded through the interface 181 to the personal computer, and the data Db can be processed in the personal computer. If the data Db include audio data, the personal computer can play the audio data and produce sounds based on the data using a speaker. The clock circuit 183 is in full-time operation. The clock circuit 183 measures the correct time and generates data representing the current time. The data is output from the processing circuit 18 to the modulation/demodulation circuit 17 according to demand.

The control circuit 19 controls the selection circuit 16, the modulation/demodulation circuit 16, and the processing circuit 18.

The power receiving apparatus B2 includes a converter 21' (corresponding to the converter 21 of the First Embodiment), the rectification circuit 23, the large-capacity capacitor 24, the clock circuit 25, a selection circuit 27, a modulation/demodulation circuit 28, a processing circuit 29, and a control circuit 30.

The converter 21' has the same mechanical structure as the actuator 21 of the First Embodiment. The converter 21' is different from the converter 21 of the First Embodiment in that the converter 21' functions as a converter for converting electrical energy into kinetic energy and kinetic energy into electrical energy. The converter 21 of the First Embodiment converts kinetic energy into electrical energy, but does not perform the reverse conversion.

The selection circuit 27 is controlled by the control circuit 30. The selection circuit 27 connects the rectification circuit 23 and the converter 21' or the modulation/demodulation circuit 28 and the converter 21'.

The modulation/demodulation circuit 28 is in a complementary relationship with the modulation/demodulation circuit 17. The modulation/demodulation circuit 28 performs return zero modulation/demodulation. The modulation/demodulation circuit 28 operates as a modulation circuit when transmitting data Db from the power receiving apparatus B2 to the power feeding apparatus A2 or as a demodulation circuit when transmitting data Da from the power feeding apparatus A2 to the power receiving apparatus B2.

The processing circuit 29 includes an input microphone 191, an AD converter 192, an input button 193, memory 194, and the like. The input microphone 191 converts sound into an electrical signal and outputs the signal to the AD converter 192. The AD converter 192 converts the analog audio signal into digital data and supplies the data to the memory 194. The memory 194 stores audio data, input data, and the data Da forwarded from the power feeding apparatus A2. The input data can be input by the user who operates the input button 193.

When the data Da representing the time information is forwarded from the power feeding apparatus A2, the processing circuit 29 forwards the data Da to the clock circuit 25. In response, the clock circuit 25 detects the correct current time and automatically sets the time based on the correct time. Under the control of the control circuit 30, the processing circuit 29 outputs audio data and input data according to demand.

The control circuit 30 controls the selection circuit 27, the modulation/demodulation circuit 28, and the processing circuit 29. The control circuit 30 detects a charging voltage of the large-capacity capacitor 24 and compares the detected charging voltage with a first reference voltage and a second reference voltage.

[2-1: Operation of the Second Embodiment]

An operation of the power transfer system according to the Second Embodiment is described hereinafter.

In this power transfer system, there are a first mode primarily for transferring power, a second mode for transferring power and transmitting data, and a third mode for transmitting data.

FIG. 4 is a timing chart for illustrating an operation in the first mode. In the first mode, power is transferred from the power feeding apparatus A2 to the power receiving apparatus B2. When the power receiving apparatus B2 is used for a long period of time and almost no power is accumulated in the large-capacitance capacitor 24, the voltage of the large-capacitance capacitor 24 decreases, thus impairing the modulation/demodulation circuit 28 and the processing circuit 29. In such a case, it is useless to transfer the data Da from the power feeding apparatus A2 to the power receiving apparatus B2. Therefore, the operation primarily for transferring power is performed in the first mode, and the large-capacitance capacitor 24 of the power receiving apparatus B2 is charged. When the modulation/demodulation circuit 28 and the processing circuit 29 function normally by means of the charged power, the overall system is controlled to shift from the first mode to the second mode.

This point is described in detail below. As shown in FIG. 4, a control signal CTL is supplied to the selection circuit 16. The control signal CTL reaches a high level in a period Ta and a low level in a period Tb. The selection circuit 16 connects the drive circuit 11 to the converter 12' when the control signal CTL is at the high level. In contrast, the selection circuit 16 connects the modulation/demodulation circuit 17 to the converter 12' when the control signal is at the low level. The modulation/demodulation circuit 17 operates as the modulation circuit in the first mode.

In the period Ta, the sinusoidal driving signal V is supplied to the piezoelectric devices 121 and 122 of the power feeding apparatus A2, thus vibrating the piezoelectric devices 121 and 122. This vibration is transmitted through the vibration transmission members 14 and 20 to the piezoelectric devices 211 and 212 of the power receiving apparatus B2.' Accordingly, an electromotive voltage Vg is generated in the piezoelectric devices 211 and 212, as shown in the drawing.

In the period Tb, the power feeding apparatus A2 is in a waiting state for receiving data Db1 to be transmitted from the power receiving apparatus B2. The data Db1 instructs switching from the first mode to the second mode. In this example, the large-capacitance capacitor 24 is not adequately charged, and the data Db1 is not forwarded from the power receiving apparatus B2 to the power feeding apparatus A2. Thus, the period Ta and the period Tb are repeatedly encountered, and the first mode continues until the voltage of the large-capacitance capacitor 24 exceeds the first reference voltage. When the period Ta and the period Tb are compared with each other, the relationship between them is Ta>Tb. When the period Ta is set to be longer than the period Tb, it is possible to provide a sufficient charging period. It is thus possible to terminate the first mode in a short period of time and to promptly shift from the first mode to the second mode.

FIG. 5 is a timing chart for illustrating an operation in the second mode. When the voltage of the large-capacitance capacitor 24 is increased to the first reference voltage, and thus the modulation/demodulation circuit 28 and the processing circuit 29 become operable in the period Ta shown in the drawing, the control circuit 30 detects the state. The control circuit 30 then instructs the processing circuit 29 to output the data Db1 in the period Tb, as shown in the drawing. When the processing circuit outputs the data Db1 in response to the instruction, the data Db1 is modulated by the modulation/demodulation circuit 28 and is supplied to the piezoelectric devices 211 and 212 of the converter 21', thus vibrating the piezoelectric devices 211 and 212. This vibration is transmitted through the vibration transmission members 20 and 14 to the piezoelectric devices 121 and 122 of the power feeding apparatus A2. An electromotive voltage Vg1 is thus generated in the piezoelectric devices 121 and 122, as shown in the drawing.

The electromotive voltage Vg1 is supplied through the selection circuit 16 to the modulation/demodulation circuit 17. The electromotive voltage Vg1 is demodulated in the modulation/demodulation circuit 17 and is output as the data Db1. The data Db1 is forwarded through the processing circuit 18 to the control circuit 19. Accordingly, the control circuit 19 detects that the power receiving apparatus B2 is charged to a certain level and that it is possible to shift from the first mode to the second mode.

In accordance with the second mode, the control circuit 19 repeatedly performs power transfer, data reception, and data transmission. The control circuit 19 controls the power feeding apparatus A2 so that the power feeding apparatus A2 operates using time-sharing. As shown in the drawing, symbol Tc represents a power transfer period, symbol Td denotes a data reception period, and symbol Te represents a data transmission period. In this case, the power transfer period Tc overall is reduced compared with that in the first mode. This is not a problem because the voltage of the large-capacitance capacitor 24 is adequately increased to operate the modulation/demodulation circuit 28 and the processing circuit 29.

When the processing circuit 29 of the power receiving apparatus B2 outputs data Db2 in the data reception period Td, the modulation/demodulation circuit 28 modulates the data Db2 and generates a modulating signal. When the modulating signal is supplied through the selection circuit 27 to the converter 21', the voltage corresponding to the modulating signal is applied to the piezoelectric devices 211 and 212. Accordingly, the piezoelectric devices 211 and 212 vibrate. This vibration is transmitted through the vibration transmission members 20 and 14 to the piezoelectric devices 121 and 122 of the power feeding apparatus A2, thus generating an electromotive voltage Vg2 in the piezoelectric devices 121 and 122, as shown in the drawing. The electromotive voltage Vg2 is applied through the selection circuit 16 to the modulation/demodulation circuit 17. The electromotive voltage Vg2 is demodulated in the modulation/demodulation circuit 17 and is output as the data Db2. Accordingly, the power feeding apparatus A2 obtains the data Db2.

In the data transmission period Te, the data Da is transmitted from the power feeding apparatus A2 to the power receiving apparatus B2. Since this processing is merely the reverse of that in the data reception period Td, description thereof is omitted. When the data Da includes the time information representing the current time, the processing circuit 29 detects the information and forwards the data Da to the clock circuit 25. The clock circuit 25 then sets the time based on the time information represented by the data Da. Accordingly, the time is set automatically.

Although the large-capacitance capacitor 24 is charged in the second mode, a secondary battery generally deteriorates when overcharged. Thus, the control circuit 30 monitors the voltage of the large-capacitance capacitor 24. When the voltage reaches the second reference voltage, the control circuit 30 instructs the processing circuit 29 to generate data Db3 to instruct shifting from the second mode to the third mode. When the processing circuit 29 generates the data Db3, the data Db2 is transmitted to the power feeding apparatus A2 along a path from the modulation/demodulation circuit 28→the selection circuit 27→the converter 21'→the vibration transmission members 20 and 14→the converter 16→the modulation/demodulation circuit 17→the processing circuit 18→the control circuit 19. The control circuit 19 thus shifts the mode from the second mode to the third mode, and the data reception period Td and the data transmission period Te are repeatedly encountered.

When data transmission/reception is completed, data indicating the completion is transmitted to the two apparatuses, and the entire operation is terminated.

As described above, in the Second Embodiment, in addition to power transfer, data transmission is performed between the power feeding apparatus A2 and the power receiving apparatus B2. Hence, it is possible to perform data transmission between the two apparatuses without using data input/output terminals.

In addition, use of the power receiving apparatus B2 is substantially expanded. For example, when the power receiving apparatus B2 is applied to a cellular phone, a user can store a phone number of a person who was met while the user was away from home. Subsequently, the user can arrange for the phone number to be stored a personal computer while charging the cellular phone.

3. Modifications

The present invention is not limited to the above embodiments and may include various modifications described hereinafter.

(1) In the above embodiments, the continuous driving signal V is employed to drive the piezoelectric devices 121 and 122 of the power feeding apparatus when transferring power. However, the present invention is not limited to these embodiments. For example, the piezoelectric devices 121 and 122 in the power feeding apparatus can be driven by intermittent pulses (driving signals having different duty ratios), as shown in FIG. 6. In this case, power can be recovered from the piezoelectric devices 121 and 122 in the course of vibration attenuation. This modification is particularly effective when the Q factor of resonance characteristics in the natural oscillation frequency f is high. In this case, when the pulse width W is set to correspond to a half of the cycle of the natural oscillation frequency f, the vibrations are strengthened when the pulse rises and falls. Hence, the attenuation period is prolonged.

(2) In the above embodiments, the vibration transmission members 14 and are formed independently of the casings 15 and 26. However, the present invention is not limited to these embodiments. The vibration transmission members 14 and 20 can be integrated with the casings 15 and 26, respectively. FIG. 7 is a sectional view of an example of a case in which the vibration transmission members and the casings are integrated. As shown in the drawing, a cylindrical vibration transmission member 14' is formed on the casing 15 of a power feeding apparatus A3. A cylindrical vibration transmission member 20' is formed on the casing 26 of a power receiving apparatus B3. A disk-shape shim plate 120' functioning as an elastic body is attached on a top surface of the vibration transmission member 20'. Annular piezoelectric devices 121' and 122' are attached on top and bottom surfaces of the shim plate 120'. When the vibration transmission member 14' vibrates in the longitudinal direction, the vibration transmission member 20' vibrates in the longitudinal direction. The piezoelectric devices 121' and 122' vibrate in a direction indicated by arrows in the drawing, thus generating an electromotive voltage. With this arrangement, the fixing member can be omitted. Furthermore, the number of components can be reduced since the vibration transmission members 14' and 20' and the casings 15 and 26 are integrated, respectively.

(3) In the above embodiments, the vibration is transmitted to the piezoelectric devices through the vibration transmission member 20. Alternatively, a piezoelectric device may be fixed on an inner bottom surface of the casing 26, as shown in FIG. 8. Concerning a portable electronic timepiece, there is a type having a piezoelectric device on a back cover for generating an alarm sound. When this example is applied to such a timepiece, the piezoelectric device may serve both as one for generating an alarm sound and one for transmitting data.

A piezoelectric device of the power feeding apparatus, in addition to that of the power receiving apparatus, can be directly fixed on an inner top surface of the casing.

(4) In the above embodiments, the top surface of the vibration transmission member 14 and the bottom surface of the vibration transmission member 20 are planar. As shown in FIG. 9, the top surface of the vibration transmission member 14 may be provided with a convex portion and the vibration transmission member may be provided with a concave portion engageable with the convex portion. Alternatively, the reverse relationship is possible. In short, one of the vibration exciter and the vibrator is provided with the concave portion and the other with the convex portion, and the concave portion and the convex portion engage with each other. In this case, energy can be efficiently transferred since the vibration exciter and the vibrator are rigidly connected with each other.

(5) In the above embodiment, the vibration transmission member 14 and the vibration transmission member 20 perform power transfer and data transmission by means of vertical vibrations. However, the present invention is not limited to these embodiments. Any type of vibration is acceptable as long as such vibration is employed to transfer power and data. For example, torsional vibrations can be used to transfer power and data. In this case, as shown in FIG. 10, the vibration transmission member 14 is provided with protrusions 14a, 14b, and 14c, and the vibration transmission member 20 is provided with holes 20a, 20b, and 20c engageable with the protrusions 14a, 14b, and 14c, respectively. As shown in FIG. 11, the protrusions 14a, 14b, and 14c are inserted into the holes 20a, 20b, and 20c, respectively. In this state, the vibration transmission member 14 vibrates torsionally in a direction indicated by arrows in the drawing, and in accordance with the torsional vibrations of the vibration transmission member 14, the: vibration transmission member 20 vibrates torsionally. Hence, power and data are transmitted by means of torsional vibrations.

(6) In the above embodiments, the vibration transmission member 14 is forced to vibrate by the power feeding apparatus. However, the present invention is not limited to these embodiments. For example, when a user carries a portable apparatus, such as a cellular phone, in a carrying case (storage case), the portable apparatus can be charged by means of vibrations from the movement thereof.

FIG. 12 is a sectional view of a cellular phone stored in a carrying case. As shown in the drawing, an inner bottom surface of a carrying case C is provided with a rectangular connecting pin 140 perpendicular to the bottom surface. The carrying case C is made of, for example, plastic. The connecting pin 140 that connects the carrying case C and a cellular phone D functions as an elastic member. The carrying case C may be used as a case for storing the cellular phone D in a dashboard or in door portions.

In contrast, the cellular phone D includes a jack portion 300, corresponding to the connecting pin 140, on a bottom surface of a casing 260. FIG. 13 is a plan view of the jack portion 300. As shown in FIGS. 12 and 13, the jack portion 300 includes a casing 301, a vibrator 302, and piezoelectric devices 303a and 303b. The casing 301 and the casing 260 are integrated. The vibrator 302 is formed so as to cover the casing 301. The piezoelectric devices 303a and 303b are attached to sides of the vibrator 302.

With this arrangement, when the user carries the carrying case C, the cellular phone D moves due to its own weight. The vibrator 302 is thereby deformed. In accordance with the deformation, the piezoelectric devices 303a and 303b are displaced. As shown in FIG. 12, when the connecting pin 140 and the jack portion 300 are connected, the length of the connecting pin 140 is set so that a spacing is provided between the inner bottom surface of the carrying case C and the outer bottom surface of the cellular phone D. Accordingly, the cellular phone D can easily vibrate.

Alternatively, the jack portion 300 can be arranged as shown in FIG. 14. In this case, part of the casing 260 forms the jack portion 300, and the vibrator 302 is omitted. In other words, the casing 260 serves as a vibrator. In this example, the connecting pin 14 engages at the tip thereof with the jack portion 300, and an opening area of the jack portion 300 is thus increased. Therefore, the connecting pin 14 can be easily inserted into the jack portion 300.

The piezoelectric devices 303a and 303b are employed to convert leftward and rightward displacements into electrical power. Electromotive forces of the piezoelectric devices 303a and 303b are rectified by a rectification circuit, and are accumulated in a secondary battery. Electronic circuits of the cellular phone are operated by power supplied from the secondary battery.

FIG. 15 is a sectional view of a state in which the cellular phone D and a power feeding apparatus E are interconnected. The power feeding apparatus E may be provided in a home, an office, or a vehicle. The power feeding apparatus E functions both as a stand on which the cellular phone D may be placed and as a charger for charging the cellular phone D. A casing 150 of the power feeding apparatus E is provided with a protrusion 151. Part of the casing 150 is provided with a hole into which a connecting pin 140' is inserted. A portion of the connecting pin 140' protruding from the power feeding apparatus E has the same form as the connecting pin 140. In contrast, a piezoelectric device 125 is formed between the connecting pin 140 and the protrusion 151 formed in the interior of the power feeding apparatus E. The piezoelectric device 125 functions as a converting means for converting power into vibration, as the actuator 12 described in the First and Second Embodiments. A driving signal is supplied from a drive circuit operated by power supplied from a power supply (not shown).

With this arrangement, when the driving signal is supplied to the piezoelectric device 125, the piezoelectric device 125 vibrates. Then, the connecting pin 140' vibrates, thus transferring electrical power to the cellular phone D.

Although the above examples describe a case in which power is generated based on horizontal vibrations, an example below describes a case in which power is generated based on vertical vibrations, thus charging the secondary battery.

FIG. 16 is a sectional view of the cellular phone stored in the carrying case. As shown in the drawing, in the cellular phone D, a hole is formed at the center of the bottom surface of the casing 260, and a jack portion is formed by the vibrator 302 above the hole. In addition, a piezoelectric device 303C having a form shown in FIG. 17 is attached on the vibrator 302.

In contrast, a cylindrical connecting pin 141 is formed at the center of the bottom surface of the carrying case C perpendicular with respect to the bottom surface. The diameter of the connecting pin 141 is somewhat smaller than the diameter of the jack portion. Hence, the cellular phone D is vertically movable.

With this arrangement, when the user carries the carrying case C, the cellular phone D vibrates vertically, and the vibrator 302 is deformed. In accordance with the deformation, the piezoelectric device 303c is displaced, thus generating an electromotive force. The secondary battery is thus charged by the electromotive force.

In the above arrangement, the connecting pin 141 is formed protruding from the carrying case C. Alternatively, as shown in FIG. 18, a protrusion 261 is formed on the bottom surface of the casing 260 in the cellular phone D, and a concave portion 262 associated with the shape of the protrusion 261 is formed on the carrying case C.

As described above, according to these modifications, the carrying case C and the cellular phone D having substantially simple structures are formed. When the cellular phone D is stored in the carrying case C and is carried, the cellular phone D can be automatically charged. In addition, the cellular phone D can be charged by shaking the carrying case C storing the cellular phone D. Hence, it is not necessary to use a primary battery. This solves the burdensome problem involved with replacing and discarding the battery. Furthermore, since it is only necessary to deform the vibrator 302 by vibrations, it is not necessary to construct the inner perimeter of the jack portion 300 and the connecting pins 140, 140', and 141 of conductive metal. Thus, the carrying case C and the cellular phone D may be easily made waterproof.

4. Advantages

As described above, according to the present invention, power and data can be transmitted and received by means of vibrations. Therefore, it is not necessary to provide an additional terminal for power transfer and data input/output, thus improving power transfer and data transmission reliability and preventing noise pickup.

What is claimed is:

1. A power feeding apparatus for converting electrical energy into mechanical energy in the form of vibrations that are adapted to be input to a power receiving apparatus, the power feeding apparatus comprising:
   an electrical power supply;
   a drive circuit, in electrical communication with the electrical power supply, that outputs a drive signal;
   a vibration exciter including
      an excitation surface in which vibrations are induced,
      a contact surface that is in communication with the excitation surface and that is adapted to mechanically contact and transmit at least some of the induced vibrations to the power receiving apparatus to thereby transfer mechanical energy to the power receiving apparatus, and
   an actuator in electrode-less contact with the excitation surface, wherein the actuator receives the drive signal and induces the vibrations in the excitation surface in response to the drive signal.

2. A power feeding apparatus according to claim 1, wherein the actuator comprises a piezoelectric device.

3. A power feeding apparatus according to claim 1, further comprising a casing, and wherein the vibration exciter is part of the casing.

4. A power feeding apparatus according to claim 1, wherein the actuator causes the vibration exciter to vibrate in a direction substantially perpendicular to the contact surface.

5. A power feeding apparatus according to claim 1, wherein the actuator causes the vibration exciter to vibrate torsionally.

6. A power feeding apparatus according to claim 1, wherein the contact surface of the power feeding apparatus is in direct contact with a contact surface of the power receiving apparatus, so that direct energy transmission can be achieved without an intermediate element between the two contact surfaces.

7. A power receiving apparatus adapted to convert mechanical energy in the form of vibrations, adapted to be received from a power feeding apparatus, into electrical energy, the power receiving apparatus comprising:
   a vibrator having a contact surface that is adapted to mechanically contact and receive vibrations from the power feeding apparatus and to vibrate in response to the received vibrations;
   a converter, in electrode-less mechanical contact with the vibrator, that converts the vibrations of the vibrator into electrical energy, the converter also being in communication with an external circuit through which the electrical energy is transmitted; and
   a secondary battery for storing electrical energy converted by the converter.

8. A power receiving apparatus according to claim 7, wherein the converter includes a piezoelectric device mechanically coupled to the vibrator that is displaced in response to the vibrations of the vibrator, and converts such displacement into a voltage.

9. A power receiving apparatus according to claim 7, wherein the vibrator and the converter are integrated, and the converter converts the vibrations of the vibrator into electrical energy in a resonance state.

10. A power receiving apparatus according to claim 7, further comprising a casing to which the vibrator is connected.

11. A power receiving apparatus according to claim 7, further comprising a casing formed in part by the vibrator.

12. A portable apparatus comprising a power receiving apparatus as set forth in claim 7, and further comprising a power-using unit activated by power supplied from the secondary battery.

13. A portable apparatus according to claim 12, further comprising a receiving member formed in the vibrator into which a connecting member of a storage case is adapted to be inserted.

14. A portable apparatus according to claim 12, wherein the vibrator serves as a casing for the portable apparatus and has a protrusion formed therein which is adapted to be inserted into a concave portion of a storage case.

15. A timepiece comprising a power receiving apparatus as set forth in claim 7, and further comprising a clock unit for receiving power supplied from the secondary battery and for measuring time.

16. A power receiving apparatus according to claim 7, wherein the contact surface of the power feeding apparatus is in direct contact with a contact surface of the power feeding apparatus, so that direct energy transmission can be achieved without an intermediate element between the two contact surfaces.

17. A power transfer system, comprising:
a power feeding apparatus comprising
an electrical power supply;
a drive circuit, in electrical communication with the electrical power supply, that outputs a drive signal;
a vibration exciter including an excitation surface in which vibrations are induced, and a first contact surface that is in communication with the excitation surface and that vibrates in response to vibration of the excitation surface; and
an actuator in electrode-less contact with the excitation surface, wherein the actuator receives the drive signal and induces the vibrations in the excitation surface in response to the drive signal; and
a power receiving apparatus comprising
a vibrator including a second contact surface that is in mechanical contact with the first contact surface, that receives vibrations from the first contact surface, and that vibrates in response to the received vibrations;
a converter, in electrode-less mechanical contact with the vibrator, that converts the vibrations of the vibrator into electrical energy, the converter also being in communication with an external circuit through which the electrical energy is transmitted; and
a secondary battery for storing electrical energy converted by the converter;
wherein electrical energy is transferred from the power feeding apparatus to the power receiving apparatus by transmitting vibrations of the vibration exciter to the vibrator.

18. A power transfer system according to claim 17, wherein the vibration exciter protrudes from the power feeding apparatus and engages the vibrator of the power receiving apparatus.

19. A power transfer system according to claim 17, wherein one of the vibration exciter and the vibrator has a concave portion and the other has a convex portion, the concave portion and the convex portion being engageable with each other.

20. A power transfer system according to claim 17, wherein the drive circuit drives the actuator so that the vibration exciter vibrates at a frequency near a natural oscillation frequency of the vibrator.

21. A power transfer system according to claim 17, wherein the vibration exciter vibrates the vibrator intermittently and the converter converts the vibrations of the vibrator into electrical energy, including in the course of vibration attenuation.

22. A power transfer system according to claim 17, wherein the first contact surface is in direct contact with the second contact surface, so that direct energy transmission can be achieved without an intermediate element between the two contact surfaces.

23. A power transfer method for transferring electrical energy from a power feeding apparatus including a power supply, an actuator, and a vibration exciter to a power receiving apparatus including a vibrator, the power transfer method comprising the steps of:
generating an electrical driving signal with electrical energy from the power supply;
supplying the electrical driving signal to the actuator which is in electrode-less contact with the vibration exciter;
driving the actuator in response to the electrical driving signal to induce vibrations in the vibration exciter;
transferring the vibrations in the vibration exciter to the vibrator through direct mechanical contact between the vibration exciter and the vibrator, and converting vibrations in the vibrator into electrical energy.

24. A power transfer method for transferring electrical energy and data between a power feeding apparatus, including a first piezoelectric device in communication with a drive circuit, and a first vibration transmission member in electrode-less contact with the first piezoelectric device; and a power receiving apparatus, including a second piezoelectric device in communication with an external circuit, and a second vibration transmission member in electrode-less contact with the second piezoelectric device, the power transfer method comprising the steps of:
bringing the first vibration transmission member into contact with the second vibration transmission member;
transferring electrical energy from the power feeding apparatus to the power receiving apparatus during a first predetermined time period;
transmitting first data from the power feeding apparatus to the power receiving apparatus during a second predetermined time period; and
transmitting second data from the power receiving apparatus to the power feeding apparatus during a third predetermined time period.

25. A power transfer method according to claim 24, wherein
the step of transferring electrical energy comprises the steps of:
applying a voltage to the first piezoelectric device to induce vibrations in the first piezoelectric device;
vibrating the first vibration transmission member with the vibrations of the first piezoelectric device;
vibrating the second vibration transmission member with the vibrations of the first vibration transmission member;
vibrating the second piezoelectric device with the vibrations of the second vibration member to generate a first electromotive voltage; and
generating electrical energy from the first electromotive voltage.

26. A power transfer method according to claim 25, wherein
the step of transferring first data further comprises the steps of:
applying a voltage to the first piezoelectric device in accordance with the first data to be transferred and vibrating the first piezoelectric device;
vibrating the first vibration transmission member with the vibrations of the first piezoelectric device;

vibrating the second vibration transmission member with the vibrations of the first vibration transmission member;

vibrating the second piezoelectric device with the vibrations of the second vibration transmission member to generate a second electromotive voltage; and reading the first data based on the second electromotive voltage generated by the second piezoelectric device.

27. A power transfer method according to claim 25, wherein the step of transferring second data comprises the steps of:

applying a voltage to the second piezoelectric device in accordance with the second data to be transferred to induce vibrations in the second piezoelectric device;

vibrating the second vibration transmission member with the vibrations of the second piezoelectric device;

vibrating the first vibration transmission member with the vibrations of the second vibration transmission member;

vibrating the first piezoelectric device with the vibrations of the first vibration transmission member to generate a third electromotive voltage; and reading the second data based on the third electromotive voltage generated by the first piezoelectric device.

28. A power transfer method according to claim 24, wherein the bringing step comprises bringing the first vibration transmission member into direct contact with the second transmission member, so that direct energy transmission can be achieved without an intermediate element between the two transmission members.

* * * * *